United States Patent
Murase et al.

(10) Patent No.: US 7,829,813 B2
(45) Date of Patent: Nov. 9, 2010

(54) TOUCH SENSOR SWITCH

(75) Inventors: Keiji Murase, Aichi (JP); Seiya Murase, Aichi (JP); Masahiko Miyata, Aichi (JP); Katsuhide Kumagai, Aichi (JP); Kenji Iwasaki, Aichi (JP); Kazuki Yamaguchi, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 386 days.

(21) Appl. No.: 12/106,999

(22) Filed: Apr. 21, 2008

(65) Prior Publication Data
US 2008/0257707 A1    Oct. 23, 2008

(30) Foreign Application Priority Data
Apr. 23, 2007    (JP) .............................. 2007-113118

(51) Int. Cl.
*H03K 17/795* (2006.01)
(52) U.S. Cl. ....................................... 200/600; 200/517
(58) Field of Classification Search ................. 200/600, 200/341, 345, 517, 512, 520, 530; 345/168, 345/173, 174
See application file for complete search history.

(56) References Cited

U.S. PATENT DOCUMENTS 5,270,710 A * 12/1993 Gaultier et al. ............. 200/600
5,598,527 A * 1/1997 Debrus et al. ............... 345/173
6,580,043 B1 * 6/2003 Spratte ....................... 200/512
6,670,565 B2 * 12/2003 Hanahara et al. ............ 200/314

FOREIGN PATENT DOCUMENTS

JP        5-38735 U      5/1993
JP        7-272604 A    10/1995

* cited by examiner

*Primary Examiner*—Felix O Figueroa
(74) *Attorney, Agent, or Firm*—Roberts Mlotkowski Safran & Cole, P.C.; Thomas W. Cole

(57) ABSTRACT

A touch sensor switch for easily taking out an output of a touch sensor with high reliability. Push-type switching elements 2A, 2B, and 2C are mounted on a printed circuit board 1, a rubber dome 3 is provided with expanded portions 30A, 30B, and 30C for housing the switching elements 2A, 2B, and 2C, the switching elements 2A, 2B, and 2C are provided with conductive films 41A, 41B, and 41C on an outer surface and a lower face, conductive parts 31A, 31B, and 31C are provided at a conductive part such as an upper surface of the expanded portions 30A, 30B, and 30C of the rubber dome 3, or a wiring pattern of the printed circuit board 1, and the conductive films 41A, 41B, and 41C contact with the conductive parts 31A, 31B, and 31C constantly by a biasing force of the switching elements 2A, 2B, and 2C regardless the operation of switch knobs 4A, 4B, and 4C.

14 Claims, 4 Drawing Sheets

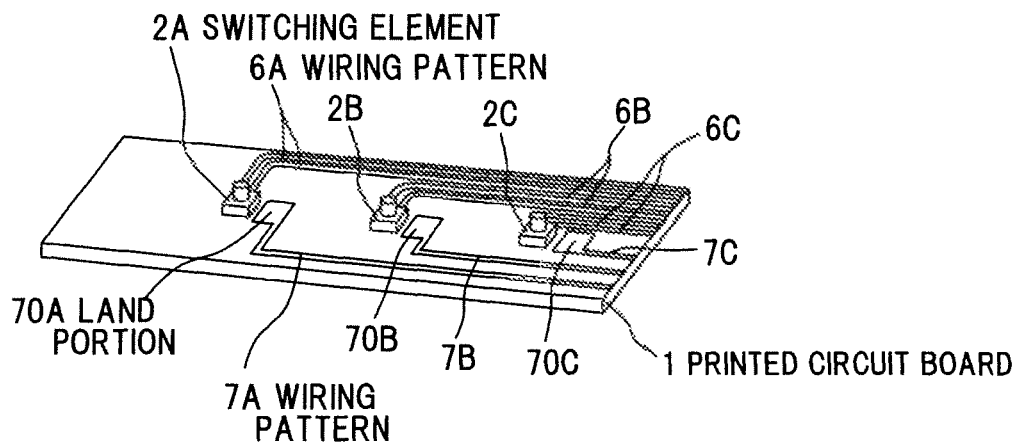
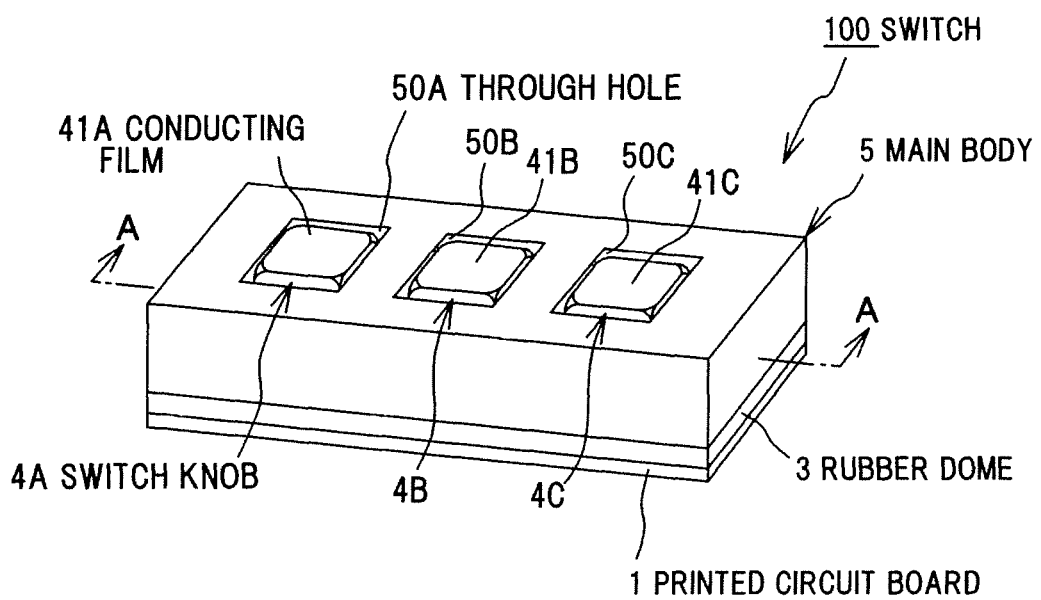

TOUCH SENSOR SWITCH

The present application is based on Japanese Patent Application No. 2007-113118 filed on Apr. 23, 2007, the entire contents of which are incorporated herein by reference.

BACKGROUND OF THE INVENTION

1. Field of the Invention

The present invention relates to a touch sensor switch.

2. Related Art

In vehicles, for example, switches each comprising a push-button or a touch sensor for starting and stopping of an operation of a mounted electronic device or an engine are used.

As one example of a conventional switch using the touch sensor, JP-A-7-272604 discloses a switch in which a conductive touch portion is provided on a surface of a tile, a touch sensor circuit is provided on a back side of the tile, the touch sensor circuit and the touch portion are connected to each other by a conductive rubber or a lead wire, and the touch sensor circuit detects an electrical alteration when a finger contacts with the touch portion to conduct an ON/OFF operation, has been known.

Further, a switch in which a push-button switch and a touch sensor are mounted on the same board is also used. In this case, the touch sensor comprises a conductive film provided on a surface of a push-button (knob) by spattering or the like. The conductive film is connected to a wiring pattern on the board by a harness.

Further, as one example of a conventional switch, in which the ON/OFF operation is conducted without using a mechanical switching element, is disclosed by JP-A-5-38735. In such a conventional switch, a conductive contact rubber is interposed between a lower terminal of a push-button and a printed circuit board, an expanded portion of the conductive contact rubber descends against its elasticity when the push-button is pushed, a contact portion of the expanded portion contacts with a wiring pattern on the printed circuit board so that the switch is turned on.

However, in the conventional switch comprising the touch sensor, since the harness is used for the connection between the conductive film and the wiring pattern of the board, metal fatigue progresses in accordance with an increase in usage frequency of the push-button or a stroke level of the harness. Since the harness is easily broken, it is not possible to enhance the reliability. Further, there are problems for productivity, cost reduction and the like, since assembling steps are increased in accordance with an increase in the number of parts.

Further, according to the structure disclosed by JP-A-5-38735, since the conductive contact rubber is used the for switch, the harness is used as a connecting means, so that it is difficult to fabricate a composite switch by combining the touch sensor and the push-button switch.

THE SUMMARY OF THE INVENTION

Therefore, it is an object of the invention to provide a touch sensor switch, in which an output of the touch sensor can be taken out easily with high reliability.

[1] According to a feature of the present invention, a touch sensor switch comprises:

a printed circuit board;.

a push-type switching element mounted on the printed circuit board;

a rubber dome comprising an expanded portion for covering the switching element and a conductive part provided at a predetermined region including an upper surface of the expanded portion;

a switch knob provided on the expanded portion of the rubber dome and comprising conductive surfaces at least at an outer face and a lower face; and a main body for holding the switch knob to reciprocally move and fixing the rubber dome.

Preferably, the rubber dome is formed to have a sheet-like shape, and the predetermined region of the conductive part of the rubber dome extends from the upper surface of the expanded portion to the conductive part of the printed circuit board.

Preferably, wherein the conductive part of the rubber dome comprises a conductive rubber or conductive polymer.

Preferably, the conductive rubber or conductive polymer comprises a carbon-containing silicone, and formed by bicolor molding for providing a silicone and the carbon-containing silicone as a whole.

Preferably, the switch knob comprises a hollow inside and a flange at a lower periphery which prevents the switch knob detaching from the main body, and such arranged that an upper surface of the flange contacts with a lower surface of a periphery of a through hole of the main body.

Preferably, the switch knob comprises a conductive film provided on outer surfaces of upper, side, and lower faces.

Preferably, the conductive film is provided by metal deposition, plating, application of a conductive coating material, or adhesion of a metal foil.

Preferably, the switching element comprises a push-button switch construed to be turned ON by pushing down a movable portion until a predetermined position.

Preferably, the movable portion of the switching element concurrently functions as a biasing means for biasing the switch knob by an incorporated spring.

Preferably, the main body is formed to have a boxy shape by resin molding and a step portion is provided for restricting a movement of a flange of the switch knob at a periphery of a through hole.

Preferably, the rubber dome comprises a plurality of rubber domes, each of which is provided individually corresponding to the each switching element.

Preferably, the conductive part of the rubber dome comprises an approximately whole region of the expanded portion and a region contacting thereto and a land portion of the printed circuit board.

Preferably, the rubber dome comprises a projecting portion at an edge opposite to the expanded portion, and the projecting portion is fitted into a hole provided in a land portion of the printed circuit board.

Preferably, the rubber dome is pressed by a part of the main body to be fixed.

EFFECT OF THE INVENTION

According to the preferred embodiment of the present invention, it is possible to take out the output of the touch sensor easily with the high reliability.

BRIEF DESCRIPTION OF THE DRAWINGS

Next, the present invention will be explained in more detail in conjunction with appended drawings, wherein:

FIG. 2 is a perspective view showing a structure on a printed circuit board shown in FIG. 1;

FIG. 3 is a perspective view showing a finished state of the switch shown in FIG. 1;

DESCRIPTION OF THE PREFERRED EMBODIMENTS

Next, preferred embodiments according to the present invention will be explained in conjunction with appended drawings.

The First Preferred Embodiment

Figure 1:
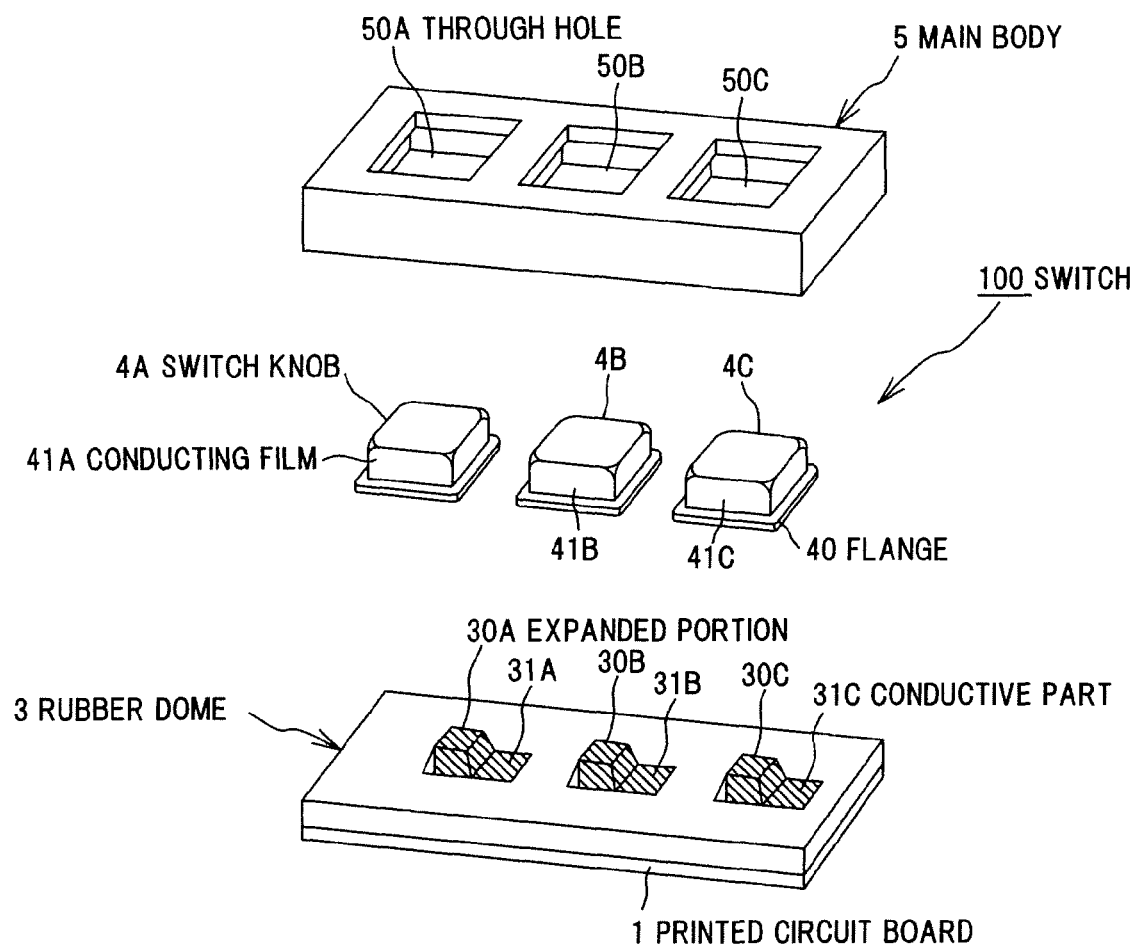
FIG. 1 is an exploded perspective view of a touch sensor switch in a preferred embodiment according to the present invention.

FIG. 1 is an exploded perspective view of a touch sensor switch in a preferred embodiment according to the present invention.

FIG. 2 is a perspective view showing a structure on a printed circuit board shown in FIG. 1.

FIG. 3 is a perspective view showing a finished state of the switch shown in FIG. 1.

Figure 4:
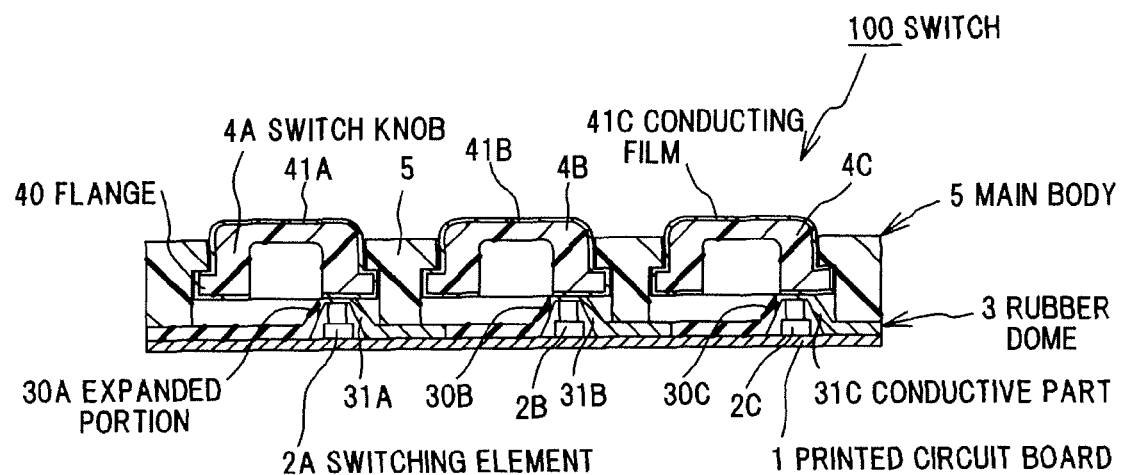
FIG. 4 is a cross sectional view along A-A line of the switch shown in FIG. 3.

FIG. 4 is a cross sectional view along A-A line of the switch shown in FIG. 3.

(Structure of the Switch)

As shown in FIG. 1, a switch 100 comprises a printed circuit board 1 having a rectangular shape, switching elements 2A, 2B, and 2C mounted on the printed circuit board 1 (as shown in FIG. 2), a rubber dome 3 provided on the printed circuit board 1 and comprising expanded portions 30A, 30B, and 30C for housing the switching elements 2A, 2B, and 2C, switch knobs 4A, 4B, and 4C provided with conductive films 41A, 41B, and 41C on outer surfaces of upper, side and lower faces and arranged on the expanded portions 30A, 30B, and 30C, respectively, and a main body 5 provided on a rubber dome 3 and comprising through holes 50A, 50B and 50C for housing the switch knobs 4A, 4B, and 4C and exposing heads of the switch knobs 4A, 4B, and 4C.

The printed circuit board 1 is mainly composed of, for example, a rectangular glass epoxy substrate. As shown in FIG. 2, pairs of wiring patterns 6A, 6B, and 6C respectively connected to the switching elements 2A, 2B, and 2C at one end, land portions 70A, 70B, and 70C each having a square shape provided adjacent to the switching elements 2A, 2B, and 2C, and wiring patterns 7A, 7B, and 7C respectively connected to the land portions 70A, 70B, and 70C, and provided in parallel to the wiring patterns 6A, 6B, and 6C are provided on a surface of the substrate.

The switching elements 2A, 2B, and 2C are push-button switches, each of which is construed to be turned ON by pushing down a movable portion until a predetermined position. Further, in each of the switching elements 2A, 2B, and 2C, the movable portion also functions as biasing means for biasing each of the switch knobs 4A, 4B, and 4C by an incorporated spring.

Preferably, a whole structure of the rubber dome 3 has restoring force, flexibility, humidity resistance, and water resistance, and a material of the rubber dome 3 may comprise, for example, silicone rubber. The rubber dome 3 is formed to have a sheet-like shape for covering all of a plurality of switching elements 2A, 2B, and 2C, and has a surface area to which a whole region of a lower surface of the main body 5 may be contacted.

Further, in the rubber dome 3, conductive parts 31A, 31B and 31C (hatched area in FIG. 1) comprises an approximately whole region of the expanded portions 30A, 30B, and 30C and a region contacting thereto and the land portions 70A, 70B, and 70C of the printed circuit board 1, and other part (a sheet portion 33) comprising a rubber having normal electrical insulation. Each of the sheet portion 33 and the conductive parts 31A, 31B, and 31C comprises a conductive rubber or conductive polymer composed of carbon-containing silicone, and may be formed, for example, by bicolor molding.

The bicolor molding is a forming method of manufacturing a one-piece product comprising two colors or two types of resins. Herein, the two kinds of the resin are silicone and "silicone+carbon".

The switch knobs 4A, 4B, and 4C are formed in accordance with the same specifications, for example, by a resin molding. Each of the switch knobs 4A, 4B, and 4C comprises a hollow inside and a flange 40 provided at a lower periphery for preventing detachment from the main body 5. Each of the switch knobs 4A, 4B, and 4C is such arranged that an upper surface of the flange 40 contacts with a lower surface of a periphery of each of the through holes 50A, 50B, and 50C of the main body 5 when being biased by each of the switching elements 2A, 2B, and 2C.

For example, the main body 5 is formed to have a boxy shape by the resin molding and a step portion is provided for restricting a movement of the flange 40 at a periphery of each of the through holes 50A, 50B, and 50C as shown in FIG. 4.

The conductive films 41A, 41B, and 41C are provided by, for example, metal deposition, plating, application of a conductive coating material, and adhesion of a metal foil and the like. The conductive films 41A, 41B, and 41C may be surface portions of conductors (block).

In other words, a conductive process is conducted on at least the upper face and the lower face of each of the switch knobs 4A, 4B, and 4C. Each of the switch knobs 4A, 4B, and 4C has conductive surfaces at least at the upper face and the lower face. The conductive surface may be a conductive layer formed by the metal deposition, plating or the like, and may be the resin impregnated with the conductive material at a skin depth.

(Assembly of the Switch)

Firstly, the switching elements 2A, 2B, and 2C are previously mounted on the printed circuit board 1 as shown in FIGS. 2-4.

Next, the rubber dome 3 is installed on the printed circuit board 1 to cover surfaces of the switching elements 2A, 2B, and 2C and the printed circuit board 1.

Next, the switch knobs 4A, 4B, and 4C are provided on the expanded portions 30A, 30B, and 30C of the rubber dome 3, respectively, and the main body 5 is held at a predetermined position after aligning the positions of the switch knobs 4A, 4B, and 4C into the through holes 50A, 50B, and 50C, respectively.

The main body 5 is fixed, for example, by covering a bezel to integrate the main body 5 with the printed circuit board 1 or by adhering the main body 5 to the printed circuit board 1 by using an adhesive. The switch 100 is thus completed.

(Operation of the Switch)

Next, the operation of the switch 100 will be explained below. Herein, the land portions 70A, 70B, and 70C shown in FIG. 2 contact with the conductive parts 31A, 31B, and 31C of the rubber dome 3, respectively, and a detecting circuit (not shown) is connected to the land portions 70A, 70B, and 70C through the wiring patterns 7A, 7B, and 7C, respectively. Further, a charge, power circuit, or the like (not shown) are connected to the switching elements 2A, 2B, and 2C through the wiring patterns 6A, 6B and 6C.

For example, when the operator touches the conductive film 41A by a finger or the like on the upper surface of the switch knob 4A shown in FIG. 2, electric characteristics such as dielectric resistance, electrostatic capacitance in a route composed of the conductive film 41A, the conductive part 31A of the expanded portion 30A, the land portions 70A, 70B, and 70C and the wiring pattern 7A are varied. The detecting circuit detects this variation in the electric characteristics to output this variation as an electric signal (touch sensor detection signal). A relay, an electric switch, and the like are driven by this output signal.

Next, when the operator pushes the switch knob 4A against a biasing force of the movable portion of the switching element 2A, the switching element 2A is pressed down by the switch knob 4A through the rubber dome 3, so that the switching element 2A is turned ON.

Although the above explanation is made for the switch knob 4A, the touch sensor and the switch are also driven by a finger contact and a pushdown operation similarly for the switch knobs 4A and 4B.

Effect of the First Preferred Embodiment

According to the first preferred embodiment, the outer surfaces and the lower surfaces of the switch knobs 4A, 4B, and 4C are formed from the conductive films 41A, 41B, and 41C, the conductive parts 31A, 31B, and 31C are provided on the upper surfaces of the expanded portions 30A, 30B, and 30C and a predetermined region of the rubber dome 3, so that the conductive films 41A, 41B, and 41C constantly contact with the conductive parts 31A, 31B, and 31C of the rubber dome 3, respectively. As a result, it is possible to prevent the touch sensor detection signals from breaking due to the movement of the switch knobs 4A, 4B, and 4C. Further, since the rubber dome 3 is formed to have a sheet-like shape, there is an effect that the water resistance is improved and the assembling workability is excellent.

The Second Preferred Embodiment

In the second preferred embodiment, the rubber dome 3 having the sheet-like shape in the first preferred embodiment is replaced with individual rubber domes 3A, 3B, and 3C corresponding to the switching elements 2A, 2B, and 2C.

Figure 5:
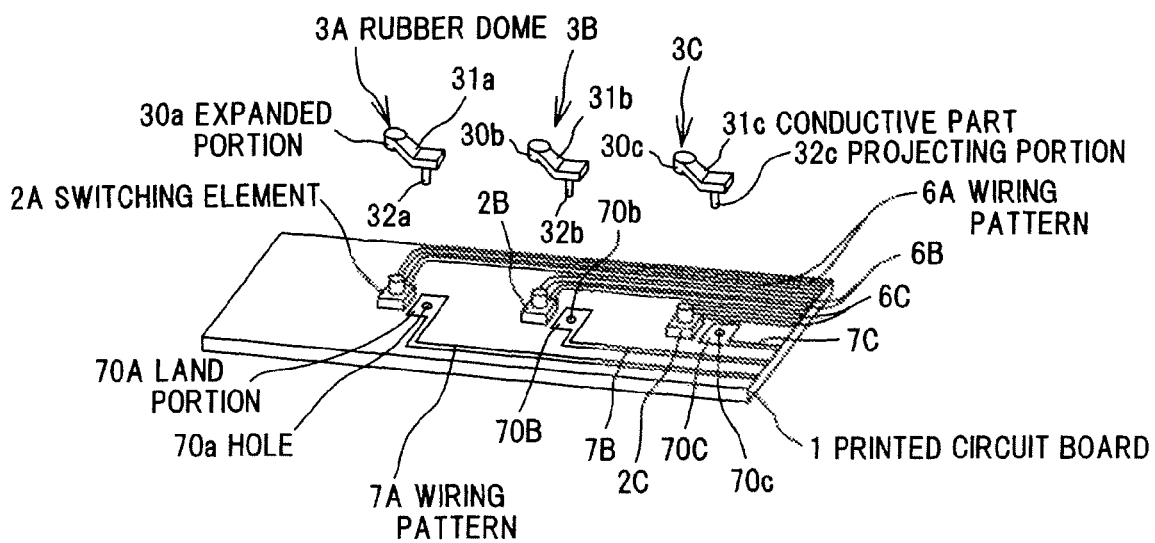
FIG. 5 is a perspective view showing rubber domes 3A, 3B, and 3C and the printed circuit board 1, in particular, showing that the rubber domes 3A, 3B, and 3C are formed individually in a second preferred embodiment.

FIG. 5 is a perspective view showing rubber domes 3A, 3B, and 3C and the printed circuit board 1. In particular, the second preferred embodiment is different from the first preferred embodiment in that the rubber domes 3A, 3B, and 3C are formed individually.

Figure 6:
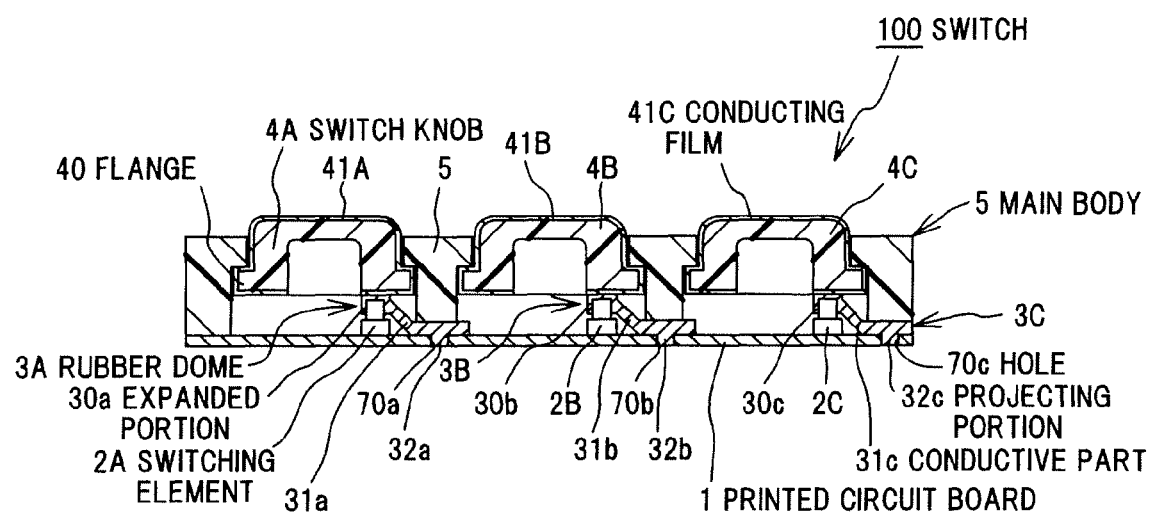
FIG. 6 is a cross sectional view along A-A line of a switch in the second preferred embodiment according to the present invention.

FIG. 6 is a cross sectional view along A-A line of a switch in the second preferred embodiment according to the present invention.

The differences of the second preferred embodiment from the first preferred embodiment will be explained below.

The rubber dome 3 is provided as the rubber domes 3A, 3B, and 3C individually corresponding to the switching elements 2A, 2B, and 2C. In the rubber domes 3A, 3B, and 3C, the conductive parts 31$a$, 31$a$ and 31$c$ comprise the approximately whole region of the expanded portions 30A, 30B, and 30C and a region contacting thereto and the land portions 70A, 70B, and 70C of the printed circuit board 1. Each of the rubber domes 3A, 3B, and 3C is mainly composed of a conductive rubber or conductive polymer comprising the silicone containing the carbon. Further, projecting portions 32$a$, 32$b$ and 32$c$ are formed at edges opposite to the expanded portions 30A, 30B, and 30C in the rubber domes 3A, 3B, and 3C respectively, and the positioning may be easily conducted by fitting the projecting portions 32$a$, 32$b$, an 32$c$ into holes 70$a$, 70$b$, and 70$c$ provided in the land portions 70A, 70B, and 70C of the printed circuit board 1. Each of the rubber domes 3A, 3B, and 3C is pressed by a part of the main body 5 to be fixed.

As described above, the whole structure of each of the rubber domes 3A, 3B, and 3C may comprises the conductive portion. However, similarly to the first preferred embodiment, the rubber domes 3A, 3B, and 3C may be formed by a bicolor molding so that only electrically connecting parts between the switch knobs 4A, 4B, and 4C to the land portions 70A, 70B, and 70C comprise the conductive portions. Since other structures and switch operations are similar to those in the first preferred embodiment except that the rubber dome 3 is provided as the rubber domes 3A, 3B, and 3C individually corresponding to the switching elements 2A, 2B, and 2C respectively, the explanation for the other structures and the switch operations is omitted.

Effect of the Second Preferred Embodiment

According to the second preferred embodiment, it is possible to form the rubber dome 3 in a compact shape and to provide a stable electrical connection while improving the assembling workability. It is possible to provide the same effects as those in the first preferred embodiment except that the rubber dome 3 is not formed in the sheet-like shape.

Other Preferred Embodiments

The present invention is not limited to the preferred embodiments, and various modifications may be provided without going beyond a scope of the concept of the present invention.

For example, although the switch knobs 4A, 4B, and 4C and the switching elements 2A, 2B, and 2C are three for each in the first and second preferred embodiments, it is possible to provide an arbitrary number of parts and the shape of the switch knobs 4A, 4B, and 4C may be other than square, for example, a circle.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A touch sensor switch comprising:

a printed circuit board;

a push-type switching element mounted on the printed circuit board;

a rubber dome comprising an expanded portion for covering the switching element and an electrically conductive part provided at a predetermined region including an upper surface of the expanded portion;

a switch knob provided on the expanded portion of the rubber dome and comprising conductive surfaces at least at an outer face that are electrically connected to each other and a lower face; and a main body for holding the switch knob to reciprocally move and fixing the rubber dome wherein the electrically conductive part of the rubber dome electrically connects the conductive surfaces of the switch knob to the circuit board.

2. The touch sensor switch according to claim 1, wherein the rubber dome is formed to have a sheet-like shape, and the predetermined region of the conductive part of the rubber dome extends from the upper surface of the expanded portion to the conductive part of the printed circuit board.

3. The touch sensor switch according to claim 1, wherein the conductive part of the rubber dome comprises a conductive rubber or conductive polymer.

4. The touch sensor switch according to claim 3, wherein the conductive rubber or conductive polymer comprises a carbon-containing silicone, and formed by bicolor molding for providing a silicone and the carbon-containing silicone as a whole.

5. The touch sensor switch according to claim 1, wherein the switch knob comprises a hollow inside and a flange at a lower periphery which prevents the switch knob detaching from the main body, and such arranged that an upper surface of the flange contacts with a lower surface of a periphery of a through hole of the main body.

6. The touch sensor switch according to claim 1, wherein the switch knob comprises a conductive film provided on outer surfaces of upper, side, and lower faces.

7. The touch sensor switch according to claim 6, wherein the conductive film is provided by metal deposition, plating, application of a conductive coating material, or adhesion of a metal foil.

8. The touch sensor switch according to claim 1, wherein the switching element comprises a push-button switch construed to be turned ON by pushing down a movable portion until a predetermined position.

9. The touch sensor switch according to claim 8, wherein the movable portion of the switching element concurrently functions as a biasing means for biasing the switch knob by an incorporated spring.

10. The touch sensor switch according to claim 1, the main body is formed to have a boxy shape by resin molding and a step portion is provided for restricting a movement of a flange of the switch knob at a periphery of a through hole.

11. The touch sensor switch according to claim 1, wherein the rubber dome comprises a plurality of rubber domes, each of which is provided individually corresponding to the each switching element.

12. The switch provided with g the touch sensor according to claim 1, wherein the conductive part of the rubber dome comprises an approximately whole region of the expanded portion and a region contacting thereto and a land portion of the printed circuit board.

13. The touch sensor switch according to claim 1, wherein the rubber dome comprises a projecting portion at an edge opposite to the expanded portion, and the projecting portion is fitted into a hole provided in a land portion of the printed circuit board.

14. The switch comprising the touch sensor according to claim 1, wherein the rubber dome is pressed by a part of the main body to be fixed.

* * * * *